US006961224B2

(12) United States Patent
Pinarbasi

(10) Patent No.: US 6,961,224 B2
(45) Date of Patent: Nov. 1, 2005

(54) GMR ENHANCING SEED LAYER FOR SELF PINNED SPIN VALVES

(75) Inventor: Mustafa Michael Pinarbasi, Morgan Hill, CA (US)

(73) Assignee: Hitachi Global Storage Technologies Netherlands, B.V., Amsterdam (NL)

(*) Notice: Subject to any disclaimer, the term of this patent is extended or adjusted under 35 U.S.C. 154(b) by 117 days.

(21) Appl. No.: 10/671,377

(22) Filed: Sep. 24, 2003

(65) Prior Publication Data

US 2005/0063105 A1 Mar. 24, 2005

(51) Int. Cl.⁷ .............................. G11B 5/127; G11B 5/39
(52) U.S. Cl. ................................................. 360/324.11
(58) Field of Search ....................... 360/324.11, 324.1, 360/324, 313, 110

(56) References Cited

U.S. PATENT DOCUMENTS

| | | | | |
|---|---|---|---|---|
| 5,583,725 A | | 12/1996 | Coffey et al. .......... | 360/324.11 |
| 5,850,323 A | * | 12/1998 | Kanai .................... | 360/324.11 |
| 5,869,963 A | | 2/1999 | Saito et al. ................. | 324/252 |
| 6,040,961 A | | 3/2000 | Gill ........................ | 360/324.11 |
| 6,046,892 A | | 4/2000 | Aoshima et al. ....... | 360/324.11 |
| 6,222,707 B1 | | 4/2001 | Huai et al. ................ | 360/324.1 |
| 6,278,592 B1 | | 8/2001 | Xue et al. .............. | 360/324.12 |
| 6,313,973 B1 | | 11/2001 | Fuke et al. .............. | 360/324.1 |
| 6,594,123 B1 | | 7/2003 | Gill et al. .............. | 360/324.12 |
| 6,833,981 B2 | * | 12/2004 | Suwabe et al. .......... | 360/324.1 |
| 2003/0002226 A1 | | 1/2003 | Lin et al. ..................... | 360/314 |
| 2003/0011942 A1 | | 1/2003 | Pinarbasi ................. | 360/324.1 |
| 2003/0035253 A1 | | 2/2003 | Lin et al. ..................... | 360/324 |

OTHER PUBLICATIONS

IBM TDB, "Self–Pinned Tunnel Valve Head", Dec. 1, 2001, No. 452, p. 2106.*

Sugita, Yasunari et al., "Nano–Oxide Layers and Specular Scattering in Spin Valves", Journal of Applied Physics vol. 89, No. 11, Jun. 1, 2001.

Lin, Tsann et al., "Effects of Oxide Seed and Cap Layers on Magnetic Properties of a Synthetic Spin Valve", Applied Physics Letters vol. 78, No. 15, Apr. 9, 2001.

* cited by examiner

Primary Examiner—Julie Anne Watko
(74) Attorney, Agent, or Firm—Zilka-Kotab, PC

(57) ABSTRACT

A magnetic head includes a seed layer structure comprising $Al_2O_3$, Ta, and NiFeCr seed layers. An antiparallel (AP) pinned layer structure is formed above the NiFeCr seed layer. A free layer is positioned above the AP pinned layer structure.

20 Claims, 10 Drawing Sheets

|  | Head A | Head B | Head C | Head D | Head E | Head F | Head G | Standard |
|---|---|---|---|---|---|---|---|---|
| SL1 | Al2O3 30A | Al2O3 30A | Al2O3 30A | Al2O3 30A | Al2O3 30A | Al2O3 30A | Al2O3 30A | Al2O3 30A |
| SL2 | Ta 30A | Ta 30A | Ta 30A | Ta 30A | Ta 30A | Ta 30A | Ta 30A | NiFeCr 25A |
| SL3 | NFeCr 15A | NiFeCr 25A | NiFeCr 30A | NiFeCr 40A | NiFeCr 50A | NiFeCr 25A | NiFeCr 25A | NiFe 8A |
| SL4 | n/a | n/a | n/a | n/a | n/a | n/a | n/a | PtMn 30A |
| AP1 | CoFe 17A | CoFe 17A | CoFe 17A | CoFe 17A | CoFe 17A | CoFe 17A | CoFe 17A | CoFe 17A |
| APC | Ru 8A | Ru 8A | Ru 8A | Ru 8A | Ru 8A | Ru 8A | Ru 8A | Ru 8A |
| AP2 | Co 17A | Co 17A | Co 17A | Co 17A | Co 17A | Co 17A | CoFe 17A | Co 17A |
| SP1 | CuO 18.8A | CuO 18.8A | CuO 18.8A | CuO 18.8A | CuO 18.8A | CuO 18.8A | CuO 18.8A | CuO 18.8A |
| FL1 | CoFe 10A | CoFe 10A | CoFe 10A | CoFe 10A | CoFe 10A | CoFe 10A | CoFe 10A | CoFe 10A |
| FL2 | NiFe 15A | NiFe 15A | NiFe 15A | NiFe 15A | NiFe 15A | NiFe 15A | NiFe 15A | NiFe 15A |
| Cap | Ta 40A | Ta 40A | Ta 40A | Ta 40A | Ta 40A | Ta 40A | Ta 40A | Ta 40A |
| dR/R | 11.18 | 16.83 | 17.51 | 18.01 | 17.63 | 16.4 | 16.5 | 15 |
| R | 31 | 26.58 | 26.16 | 25.14 | 24.44 | 26.5 | | 25 |
| Magnetostriction | | $19 \times 10^{-6}$ | | | | $24 \times 10^{-6}$ | $13 \times 10^{-6}$ | $12 \times 10^{-7}$ |

FIG. 7

GMR ENHANCING SEED LAYER FOR SELF PINNED SPIN VALVES

FIELD OF THE INVENTION

The present invention relates to magnetic heads, and more particularly, this invention relates to read heads having a new seed layer structure that improves signal and/or pinned layer stability.

BACKGROUND OF THE INVENTION

The heart of a computer is an assembly that is referred to as a magnetic disk drive. The magnetic disk drive includes a rotating magnetic disk, write and read heads that are suspended by a suspension arm above the rotating disk and an actuator that swings the suspension arm to place the read and write heads over selected circular tracks on the rotating disk. The read and write heads are directly mounted on a slider that has an air bearing surface (ABS). The suspension arm biases the slider into contact with the surface of the disk when the disk is not rotating but, when the disk rotates, air is swirled by the rotating disk adjacent the ABS of the slider causing the slider to ride on an air bearing a slight distance from the surface of the rotating disk. When the slider rides on the air bearing the write and read heads are employed for writing magnetic impressions to and reading magnetic impressions from the rotating disk. The read and write heads are connected to processing circuitry that operates according to a computer program to implement the writing and reading functions.

The write head includes a coil layer embedded in first, second and third insulation layers (insulation stack), the insulation stack being sandwiched between first and second pole piece layers. A gap is formed between the first and second pole piece layers by a nonmagnetic gap layer at an air bearing surface (ABS) of the write head. The pole piece layers are connected at a back gap. Current conducted to the coil layer induces a magnetic field into the pole pieces that fringes across the gap between the pole pieces at the ABS. The fringe field or the lack thereof writes information in tracks on moving media, such as in circular tracks on a rotating disk.

In recent read heads a spin valve sensor is employed for sensing magnetic fields from the rotating magnetic disk. The sensor includes a nonmagnetic conductive layer, hereinafter referred to as a spacer layer, sandwiched between first and second ferromagnetic layers, hereinafter referred to as a pinned layer, and a free layer. First and second leads are connected to the spin valve sensor for conducting a sense current therethrough. The magnetization of the pinned layer is pinned perpendicular to an air bearing surface (ABS) of the head and the magnetic moment of the free layer is located parallel to the ABS but free to rotate in response to external magnetic fields. The magnetization of the pinned layer is typically pinned by exchange coupling with an antiferromagnetic layer.

The thickness of the spacer layer is chosen so that shunting of the sense current and a magnetic coupling between the free and pinned layers are minimized. This thickness is typically less than the mean free path of electrons conducted through the sensor. With this arrangement, a portion of the conduction electrons is scattered by the interfaces of the spacer layer with the pinned and free layers. When the magnetic moments of the pinned and free layers are parallel with respect to one another scattering is minimal and when their magnetic moments are antiparallel scattering is maximized. An increase in scattering of conduction electrons increases the resistance of the spin valve sensor and a decrease in scattering of the conduction electrons decreases the resistance of the spin valve sensor. Changes in resistance of the spin valve sensor is a function of cos $\Theta$, where $\Theta$ is the angle between the magnetic moments of the pinned and free layers. When a sense current is conducted through the spin valve sensor, resistance changes cause potential changes that are detected and processed as playback signals from the rotating magnetic disk. The sensitivity of the spin valve sensor is quantified as magnetoresistance or magnetoresistive coefficient dr/R where dr is the change in resistance of the spin valve sensor from minimum resistance (magnetic moments of free and pinned layers parallel) to maximum resistance (magnetic moments of the free and pinned layers antiparallel) and R is the resistance of the spin valve sensor at minimum resistance. Because of the high magnetoresistance of a spin valve sensor it is sometimes referred to as a giant magnetoresistive (GMR) sensor.

FIG. 1A shows a prior art SV sensor 100 comprising a free layer (free ferromagnetic layer) 110 separated from a pinned layer (pinned ferromagnetic layer) 120 by a non-magnetic, electrically-conducting spacer layer 115. The magnetization of the pinned layer 120 is fixed by an antiferromagnetic (AFM) layer 130.

FIG. 1B shows another prior art SV sensor 150 with a flux keepered configuration. The SV sensor 150 is substantially identical to the SV sensor 100 shown in FIG. 1A except for the addition of a keeper layer 152 formed of ferromagnetic material separated from the free layer 110 by a non-magnetic spacer layer 154. The keeper layer 152 provides a flux closure path for the magnetic field from the pinned layer 120 resulting in reduced magnetostatic interaction of the pinned layer 120 with the free layer 110. U.S. Pat. No. 5,508,867 granted to Cain et al., incorporated herein by reference, discloses a SV sensor having a flux keepered configuration.

Another type of spin valve sensor is an antiparallel (AP) spin valve sensor. The AP pinned spin valve sensor differs from the simple spin valve sensor in that the AP pinned spin valve sensor has an AP pinned structure that has first and second AP pinned layers instead of a single pinned layer. An AP coupling layer is sandwiched between the first and second AP pinned layers. The first AP pinned layer has its magnetic moment oriented in a first direction, typically by exchange coupling to an antiferromagnetic pinning layer. The second AP pinned layer is positioned towards the free layer and is antiparallel coupled to the first AP pinned layer because of the minimal thickness (in the order of 8 Å) of the AP coupling layer between the first and second AP pinned layers. Accordingly, the magnetic moment of the second AP pinned layer is oriented in a second direction that is antiparallel to the direction of the magnetic moment of the first AP pinned layer.

Referring to FIG. 2A, a typical AP spin valve sensor 200 comprises a free layer 210 separated from a laminated AP-pinned layer structure 220 by a nonmagnetic, electrically-conducting spacer layer 215. The magnetization of the laminated AP-pinned layer structure 220 is fixed by an AFM layer 230. The laminated AP-pinned layer structure 220 comprises a first ferromagnetic layer 222 and a second ferromagnetic layer 226 separated by an antiparallel coupling layer (APC) 224 of nonmagnetic material. The two ferromagnetic layers 222, 226 ($FM_1$ and $FM_2$) in the laminated AP-pinned layer structure 220 have their magnetization directions oriented antiparallel, as indicated by the arrows 223, 227 (arrows pointing out of and into the plane of the paper respectively).

The AP pinned structure is preferred over the single pinned layer because the magnetic moments of the first and second AP pinned layers of the AP pinned structure subtractively combine to provide a net magnetic moment that is less than the magnetic moment of the single pinned layer. The direction of the net moment is determined by the thicker of the first and second AP pinned layers. A reduced net magnetic moment equates to a reduced demagnetization (demag) field from the AP pinned structure. Since the antiferromagnetic exchange coupling is inversely proportional to the net pinning moment, this increases exchange coupling between the first AP pinned layer and the pinning layer. The AP pinned spin valve sensor is described in U.S. Pat. No. 5,465,185 to Heim and Parkin which is incorporated by reference herein.

The AP pinned structure is also preferred because the AP pinned layers, by virtue of their self-pinning character, retain their pinned orientation in the absence of an antiferromagnetic pinning layer. Thus, the antiferromagnetic pinning layer is not a necessary component of the AP spin valve sensor. The total thickness of the AP spin valve sensor is significantly reduced without the antiferromagnetic pinning layer. Further, current shunting through the antiferromagnetic pinning layer is eliminated in current in plane (CIP) heads. The result is that the dr/R (signal) is increased.

Increasing the GMR of spin valve sensor is very critical to meet the amplitude requirements of future products. Currently, a number of seedlayer structures have been used for spin valve structures to enhance their properties. One of these seedlayer structures is $Al_2O_3$/NiFeCr(25 to 50 Å)/NiFe(8 to 15 Å)/PtMn(4 to 30 Å)/AP-1 (CoFe) .... The dr/R of a self pinned sensor from this seedlayer structure is on the order of 15%. What is needed is a new structure with improved dr/R. What is also needed is a new AP spin valve sensor with an AP pinned structure having improved magnetostriction for increased stability of the sensor.

SUMMARY OF THE INVENTION

The present invention overcomes the drawbacks and limitations described above by providing a magnetic head structure having a new seedlayer structure which maximizes GMR signal of the head and/or magnetostriction of the pinned layers. For instance, the new structure shows an increase in dr/R from the current 15% level to as high as 18% or more.

Accordingly, a magnetic head according to one embodiment includes a seed layer structure comprising $Al_2O_3$, Ta, and NiFeCr seed layers. An antiparallel (AP) pinned layer structure is formed above the NiFeCr seed layer. A free layer is positioned above the AP pinned layer structure. Preferably, the AP pinned layer structure includes at least two pinned layers having magnetic moments that are self-pinned antiparallel to each other, the pinned layers being separated by an AP coupling layer.

In one embodiment, the AP pinned layers are constructed of CoFe and Co, with the pinned layer closest to the seed layer structure preferably including the CoFe. In another embodiment, the AP pinned layers are both constructed of Co. In yet another embodiment, the AP pinned layers are both constructed of CoFe.

In an embodiment, the AP pinned layers are constructed of materials selected to maximize a magnetostriction of the AP pinned layers. In a further embodiment, a thickness of the NiFeCr seed layer is selected to maximize a GMR signal. Preferably, the head has at least a 10% stronger GMR signal over a head having a substantially similar structure (similar materials and/or thicknesses) except for the seed layers. Also preferably, the head has at least a 10% stronger GMR signal over a head having a substantially similar structure except for materials used to form the pinned layers.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

FIG. 7 is a chart illustrating properties of several new self pinned spin valve structures

BEST MODE FOR CARRYING OUT THE INVENTION

The following description is the best embodiment presently contemplated for carrying out the present invention. This description is made for the purpose of illustrating the general principles of the present invention and is not meant to limit the inventive concepts claimed herein.

Figure 1A:
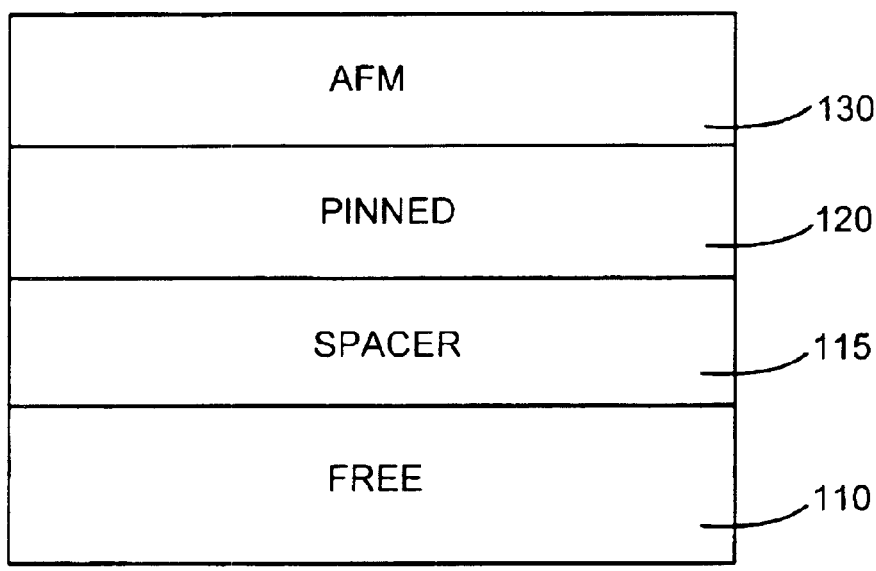
FIG. 1A is an air bearing surface view, not to scale, of a prior art spin valve (SV) sensor.
Figure 1B:
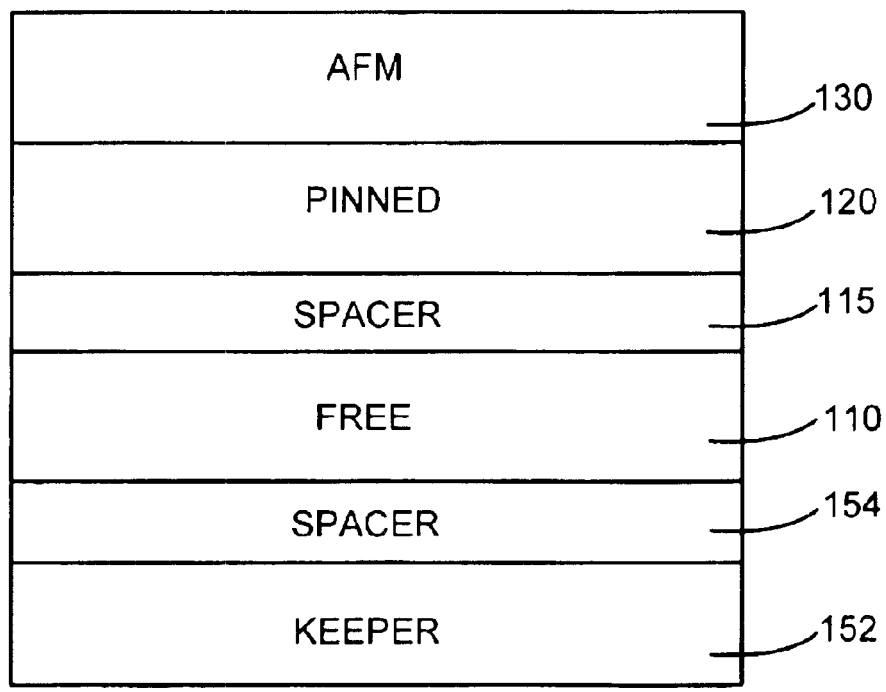
FIG. 1B is an air bearing surface view, not to scale, of a prior art keepered SV sensor.
Figure 2A:
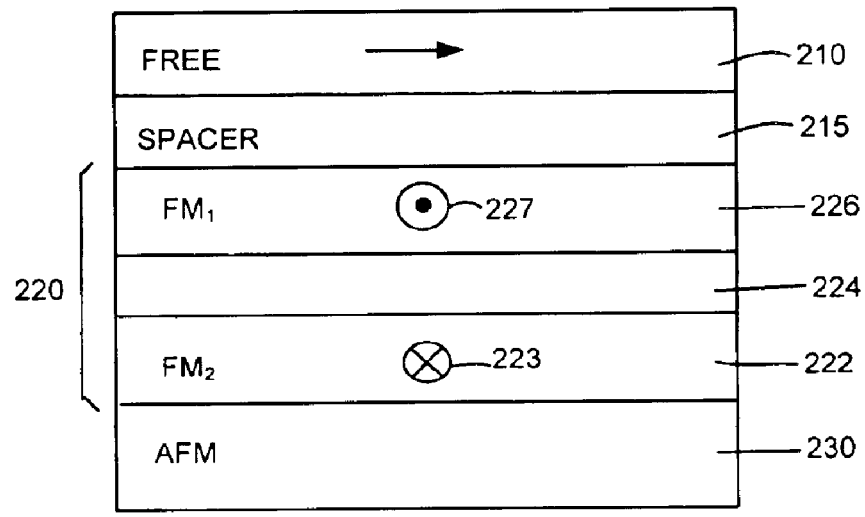
FIG. 2A is an air bearing surface view, not to scale, of a prior art AP spin valve sensor.
Figure 2B:
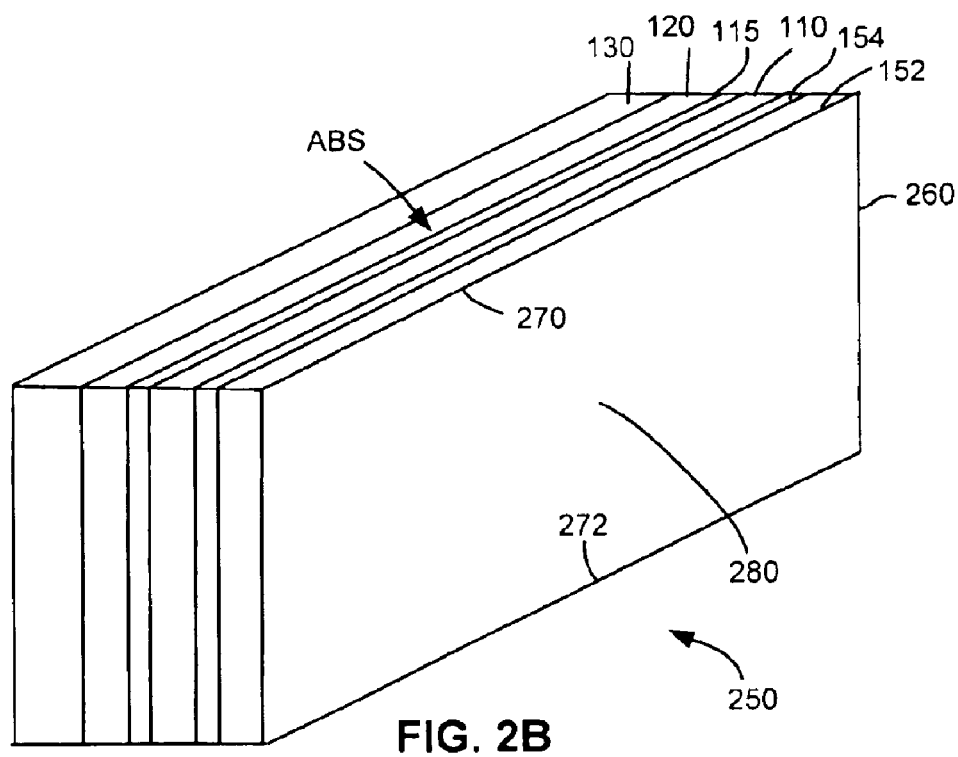
FIG. 2B is a perspective view, not to scale, of a prior art AP spin valve sensor.
Figure 3:
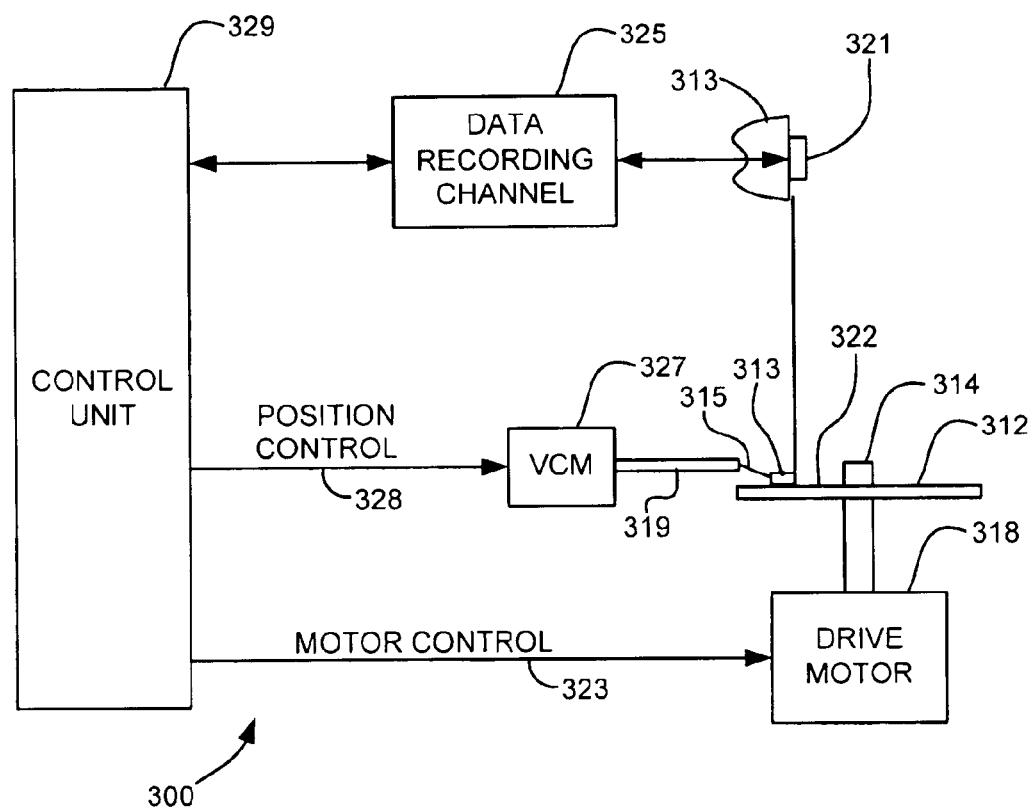
FIG. 3 is a simplified drawing of a magnetic recording disk drive system.

Referring now to FIG. 3, there is shown a disk drive 300 embodying the present invention. As shown in FIG. 3, at least one rotatable magnetic disk 312 is supported on a spindle 314 and rotated by a disk drive motor 318. The magnetic recording on each disk is in the form of an annular pattern of concentric data tracks (not shown) on the disk 312.

At least one slider 313 is positioned near the disk 312, each slider 313 supporting one or more magnetic read/write heads 321. More information regarding such heads 321 will be set forth hereinafter during reference to FIG. 4. As the disks rotate, slider 313 is moved radially in and out over disk surface 322 so that heads 321 may access different tracks of the disk where desired data are recorded. Each slider 313 is attached to an actuator arm 319 by means way of a suspension 315. The suspension 315 provides a slight spring force which biases slider 313 against the disk surface 322. Each actuator arm 319 is attached to an actuator means 327. The actuator means 327 as shown in FIG. 3 may be a voice coil motor (VCM). The VCM comprises a coil movable within a fixed magnetic field, the direction and speed of the coil movements being controlled by the motor current signals supplied by controller 329.

During operation of the disk storage system, the rotation of disk 312 generates an air bearing between slider 313 and disk surface 322 which exerts an upward force or lift on the slider. The air bearing thus counter-balances the slight spring force of suspension 315 and supports slider 313 off and slightly above the disk surface by a small, substantially constant spacing during normal operation.

The various components of the disk storage system are controlled in operation by control signals generated by control unit 329, such as access control signals and internal clock signals. Typically, control unit 329 comprises logic control circuits, storage means and a microprocessor. The control unit 329 generates control signals to control various system operations such as drive motor control signals on line 323 and head position and seek control signals on line 328. The control signals on line 328 provide the desired current profiles to optimally move and position slider 313 to the desired data track on disk 312. Read and write signals are communicated to and from read/write heads 321 by way of recording channel 325.

The above description of a typical magnetic disk storage system, and the accompanying illustration of FIG. 3 are for representation purposes only. It should be apparent that disk storage systems may contain a large number of disks and actuators, and each actuator may support a number of sliders.

Figure 4:
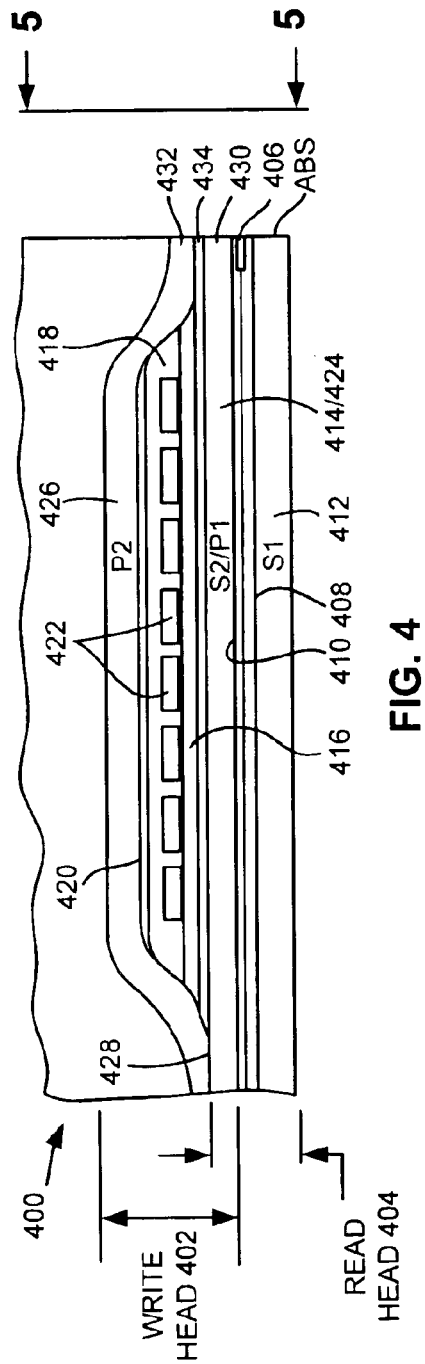
FIG. 4 is a partial view of the slider and a merged magnetic head.
Figure 5:
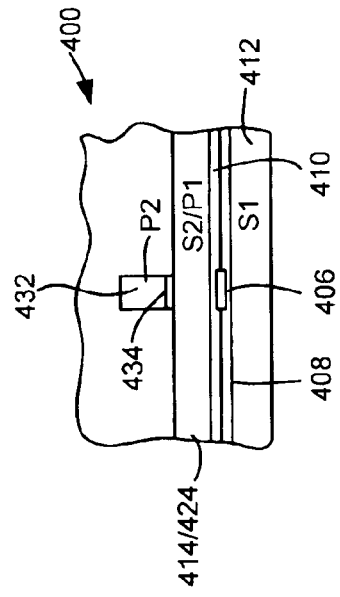
FIG. 5 is a partial ABS view, not to scale, of the slider taken along plane 5—5 of FIG. 4 to show the read and write elements of the merged magnetic head.

FIG. 4 is a side cross-sectional elevation view of a merged magnetic head 400, which includes a write head portion 402 and a read head portion 404, the read head portion employing a dual spin valve sensor 406 of the present invention. FIG. 5 is an ABS view of FIG. 4. The spin valve sensor 406 is sandwiched between nonmagnetic electrically insulative first and second read gap layers 408 and 410, and the read gap layers are sandwiched between ferromagnetic first and second shield layers 412 and 414. In response to external magnetic fields, the resistance of the spin valve sensor 406 changes. A sense current ($I_s$) conducted through the sensor causes these resistance changes to be manifested as potential changes. These potential changes are then processed as readback signals by the processing circuitry 329 shown in FIG. 3.

The write head portion 402 of the magnetic head 400 includes a coil layer 422 sandwiched between first and second insulation layers 416 and 418. A third insulation layer 420 may be employed for planarizing the head to eliminate ripples in the second insulation layer caused by the coil layer 422. The first, second and third insulation layers are referred to in the art as an "insulation stack". The coil layer 422 and the first, second and third insulation layers 416, 418 and 420 are sandwiched between first and second pole piece layers 424 and 426. The first and second pole piece layers 424 and 426 are magnetically coupled at a back gap 428 and have first and second pole tips 430 and 432 which are separated by a write gap layer 434 at the ABS. Since the second shield layer 414 and the first pole piece layer 424 are a common layer this head is known as a merged head. In a piggyback head an insulation layer is located between a second shield layer and a first pole piece layer. First and second solder connections (not shown) connect leads (not shown) from the spin valve sensor 406 to leads (not shown) on the slider 313 (FIG. 3), and third and fourth solder connections (not shown) connect leads (not shown) from the coil 422 to leads (not shown) on the suspension.

Figure 6:
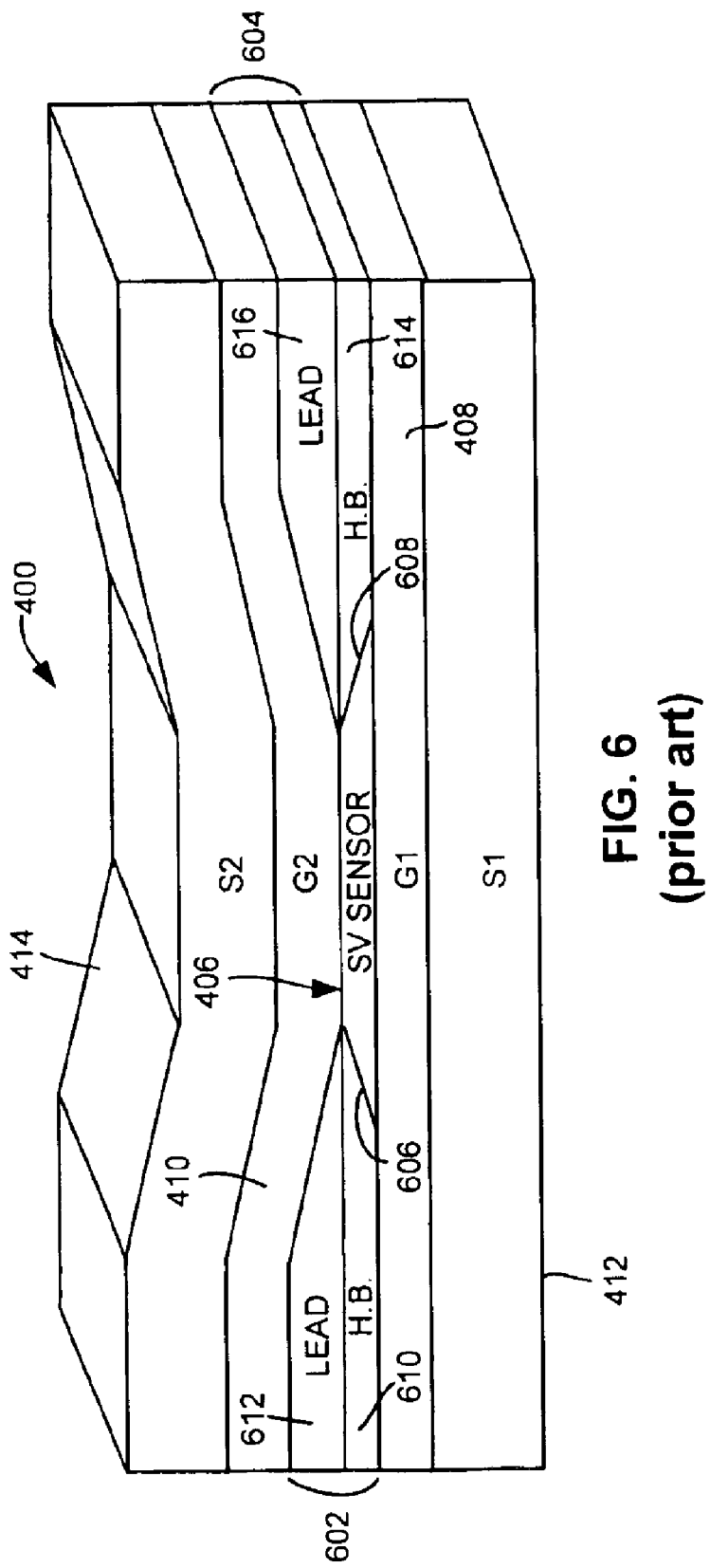
FIG. 6 is an enlarged isometric illustration, not to scale, of the read head with a spin valve sensor.

FIG. 6 is an enlarged isometric ABS illustration of the read head 400 shown in FIG. 4. The read head 400 includes the spin valve sensor 406. First and second hard bias and lead layers 602 and 604 are connected to first and second side edges 606 and 608 of the spin valve sensor. This connection is known in the art as a contiguous junction and is fully described in U.S. Pat. No. 5,018,037 which is incorporated by reference herein. The first hard bias and lead layers 602 include a first hard bias layer 610 and a first lead layer 612 and the second hard bias and lead layers 604 include a second hard bias layer 614 and a second lead layer 616. The hard bias layers 610 and 614 cause magnetic fields to extend longitudinally through the spin valve sensor 406 for stabilizing the magnetic domains therein. The spin valve sensor 406 and the first and second hard bias and lead layers 602 and 604 are located between the nonmagnetic electrically insulative first and second read gap layers 408 and 410. The first and second read gap layers 408 and 410 are, in turn, located between the ferromagnetic first and second shield layers 412 and 414.

The present invention provides a sensor structure having a new seedlayer structure which increases the dr/R of self pinned spin valve structures from the current 15% level to as high as 18% or more. Studies were performed with different seedlayers such as a) $Al_2O_3$/Ta/NiFeCr/PtMn, b) $Al_2O_3$/Ta/PtMn, c) $Al_2O_3$/Ta/Cu/PtMn, d) $Al_2O_3$/Ta, and e) $Al_2O_3$/Ta/Cu. Of all of these seedlayers, the $Al_2O_3$/Ta/NiFeCr/ . . . structure gave results superior to all other seedlayer structures including standard structures (i.e., those including an AFM layer). The signal increase from 15% to ~18% is an enormous increase for GMR. The experiments also show that the positive magnetostriction of the pinned layers are also preserved for successful pinning. In these new structures, the AFM layer (e.g., PtMn) is completely removed from the SV structure, resulting in a significant reduction of net sensor thickness. Elimination of the AFM layer also increases signal due to reduced shunting of the current through the AFM layer.

FIG. 7 is a chart 700 illustrating properties of several new self pinned spin valve structures as a function of NiFeCr thickness and/or pinned layer composition. Each of these exemplary structures is discussed in detail below. As shown in FIG. 7, the new seedlayer of $Al_2O_3$/Ta/NiFeCr improves both dr/R and magnetostriction over a standard head.

Referring again to FIG. 7, it can be seen that the thickness of the NiFeCr seed layer can be tuned to maximize the GMR signal (dr/R). For example, the 40 Å NiFeCr seed layer of Head D provides an 18% GMR, which is a 20% improvement over the standard self pinned spin valve structures (e.g., Standard Head, 15% GMR).

As also shown in FIG. 7, the materials used to construct the pinned layers can also be selected to provide stronger magnetostriction, and therefore stronger pinning of the pinned layers. Particularly, pinned layers (AP1, AP2) of CoFe nearest the seed layer and Co provide much improved magnetostriction over standard CoFe/CoFe pinned layers. The pinning field (Hk) is generally provided by the following equation:

$$Hk = 2 \cdot K_\lambda / M_s \qquad \text{Equation 1}$$

where $K_\lambda$ is the anisotropy constant and $M_s$ is the saturation magnetization.

$K_\lambda$ is determined by the following equation:

$$K_\lambda = 3/2 \cdot \sigma \cdot \lambda \qquad \text{Equation 2}$$

where σ is a measure of the stress and λ is the magnetostriction.

Per Equation 1, increasing the $K_\lambda$ increases the pinning field. Per Equation 2, increasing either stress or magnetostriction increases $K_\lambda$. For example, doubling λ doubles the Hk.

Referring to FIG. 7, Head F has a magnetostriction of about $24 \times 10^{-6}$. This is about a 40% increase over the Standard Head, and about twice as high as the magnetostriction of the pinned layers of Head G having a NiFeCr seed layer of the same thickness. Thus, per Equations 1 and 2, the pinning of the pinned layers of Head F will be much stronger than the pinning of Head G.

Thus, the concepts presented herein allow the designer to maximize signal, pinning, or both by selecting particular materials and their thicknesses. Thus, if the designer wants high magnetostriction in the head, and thus better pinning, the pinned layers can both be constructed of Co. If the designer prefers a higher signal, the pinned layers can be constructed of CoFe and Co, as in Heads A–E. As a case in point, Head B has a magnetostriction of about $19 \times 10^{-6}$, which is lower than that of Head F, but Head B has a higher dr/R for the same thickness of the NiFeCr layer.

In the following description, the width of the layers (W) refers to the track width. The sensor height is in a direction into the face of the paper. Unless otherwise described, thicknesses of the individual layers are taken perpendicular to the plane of the associated layer and are provided by way of example only and may be larger and/or smaller than those listed. Similarly, the materials listed herein are provided by way of example only, and one skilled in the art will understand that other materials may be used without straying from the spirit and scope of the present invention. Conventional processes can be used for form the structures except where otherwise noted.

Heads A–E

Figure 8:
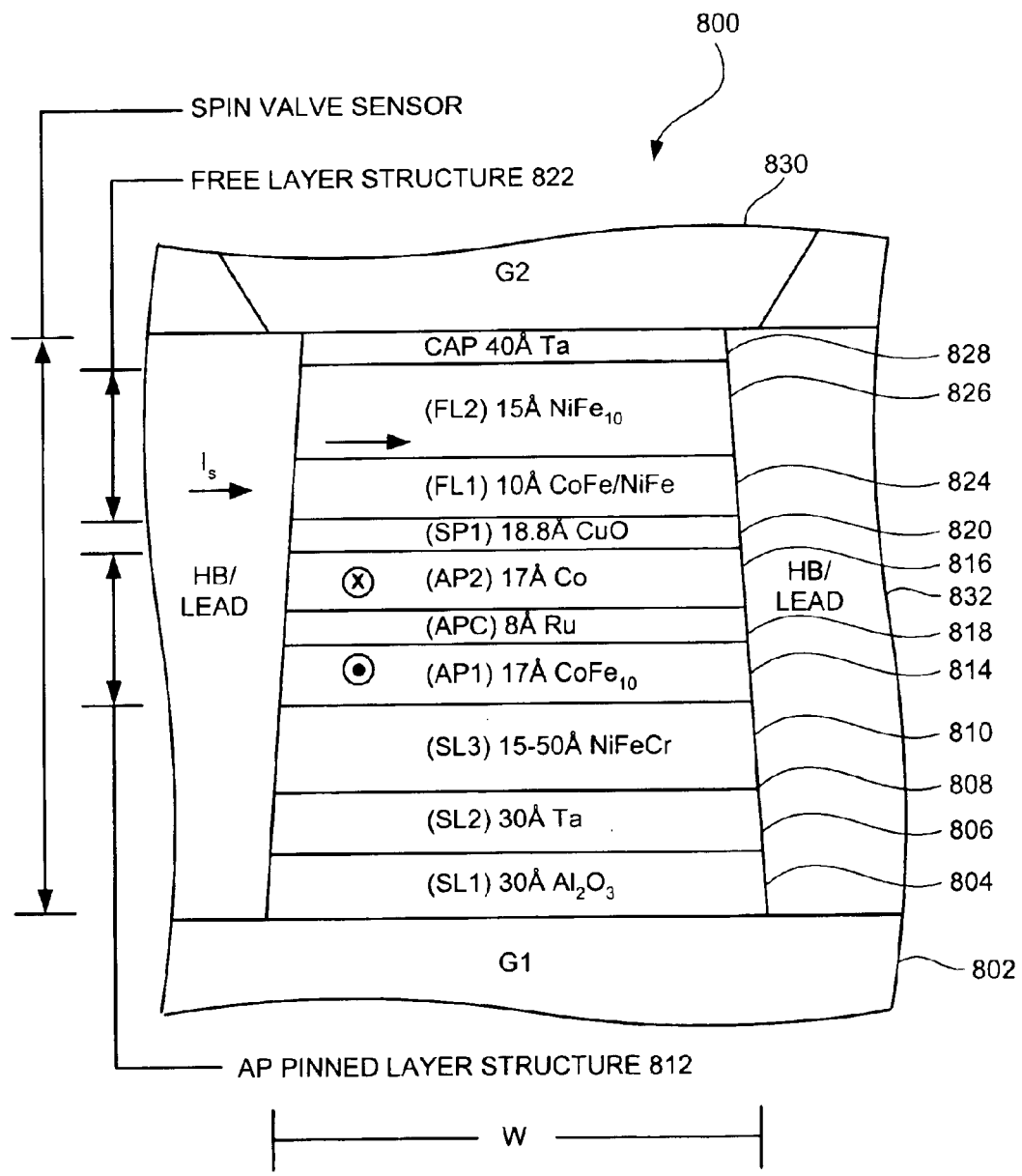
FIG. 8 is an ABS illustration, not to scale, of a GMR sensor in accordance with Heads A–E of FIG. 7.

FIG. 8 depicts an ABS view of a CIP GMR sensor 800 constructed in accordance with Heads A–F of FIG. 7. As shown in FIG. 8, a first insulative layer (G1) 802 is formed on a substrate (not shown). The first insulative layer 802 can be of any suitable material, such as alumina ($Al_2O_3$).

Seed layers are formed on the first insulative layer 802 preferably by deposition. The seed layers aid in creating the proper growth structure of the layers above them, and using the particular materials described herein, have also been found to provide definable characteristics to the head, including dr/R and magnetostriction. While not wishing to be bound by any particular theory, the inventor believes that the seed layer structure described herein causes the microstructure of the growing film to form in a certain way that results in increased dr/R and magnetostriction. The materials formed in a stack from the first insulative layer 802 are a layer of $Al_2O_3$ (SL1) 804, a layer of Ta (SL2) 806, and a layer of NiFeCr (SL3) 808. Illustrative thicknesses of these materials are $Al_2O_3$ (30 Å), Ta (30 Å), and NiFeCr (10–75 Å). Refer to FIG. 7 for the various thicknesses of the NiFeCr layer 808 in the heads discussed herein. Note that the thicknesses of any of these layers 804–808 can be varied, as mentioned above.

Then an antiparallel (AP) pinned layer structure 812 is formed above the seed layers. As shown in FIG. 8, first and second AP pinned magnetic layers, (AP1) and (AP2) 814, 816, are separated by a thin layer of an antiparallel coupling (APC) material 818 such that the magnetic moments of the AP pinned layers 814, 816 are pinned antiparallel to each other. This magnetic coupling through the Ru spacer 818 causes the pinned layers 814, 816 to have antiparallel-oriented magnetizations. The pinned layer structure 812 in turn stabilizes the free layer (described below) via exchange coupling.

In the embodiment, the pinned layers 814, 816 are CoFe, such as $CoFe_{10}$ (90% Co, 10% Fe) or $CoFe_{50}$ (50% Co, 50% Fe). separated by a Ru layer 818. Illustrative thicknesses of the first and second pinned layers 814, 816 are between about 10 Å and 25 Å. The Ru layer 818 can be about 3–10 Å, ideally about 8 Å.

A first spacer layer (SP1) 820 is formed above the pinned layer structure 812. Illustrative materials for the first spacer layer 820 include Cu, $CuO_x$, $Cu/CoFeO_x/Cu$ stack, etc.

A free layer structure 822 is formed above the first spacer layer 820. The magnetic moment of the free layer structure 822 is soft and so is susceptible to reorientation from external magnetic forces, such as those exerted by data on disk media. The relative motion of magnetic orientation of the free layer structure 822 when affected by data bits on disk media creates variations in the sensing current flowing through the sensor 800, thereby creating the signal. Exemplary materials for the free layer structure 822 are CoFe, NiFe, a CoFe/NiFe stack (FL1, FL2) 824, 826 as shown, etc. An illustrative thickness of the free layer structure 822 is about 10–40 Å.

A cap (CAP) 828 is formed above the free layer 822. Exemplary materials for the cap 828 are Ta, Ta/Ru stack, etc. An illustrative thickness of the cap 828 is 20–50 Å. In the embodiment shown in FIG. 7, the cap 828 is 40 Å.

A second insulative layer (G2) 830 is formed above the cap 828. Hard bias and leads 832 of conventional materials are formed on both sides of the sensor 800.

Head F

Figure 9:
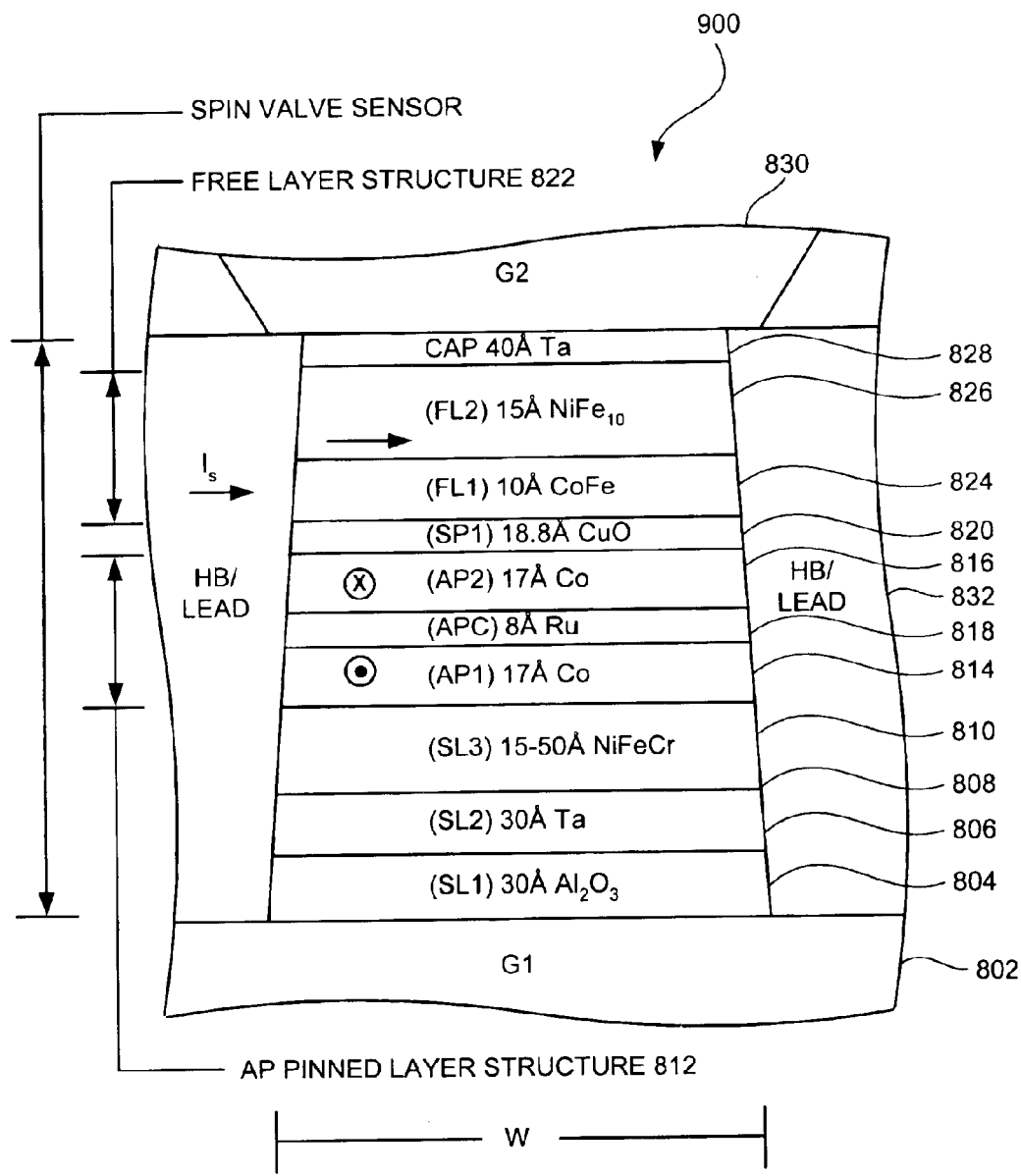
FIG. 9 depicts an ABS view, not to scale, of a GMR sensor constructed in accordance with Head F of FIG. 7.

FIG. 9 depicts an ABS view of GMR sensor 900 constructed in accordance with Head F of FIG. 7. The GMR sensor 900 generally has the same configuration as the structure shown in FIG. 8, except that pinned layers 814, 816 are each formed of Co.

Head G

Figure 10:
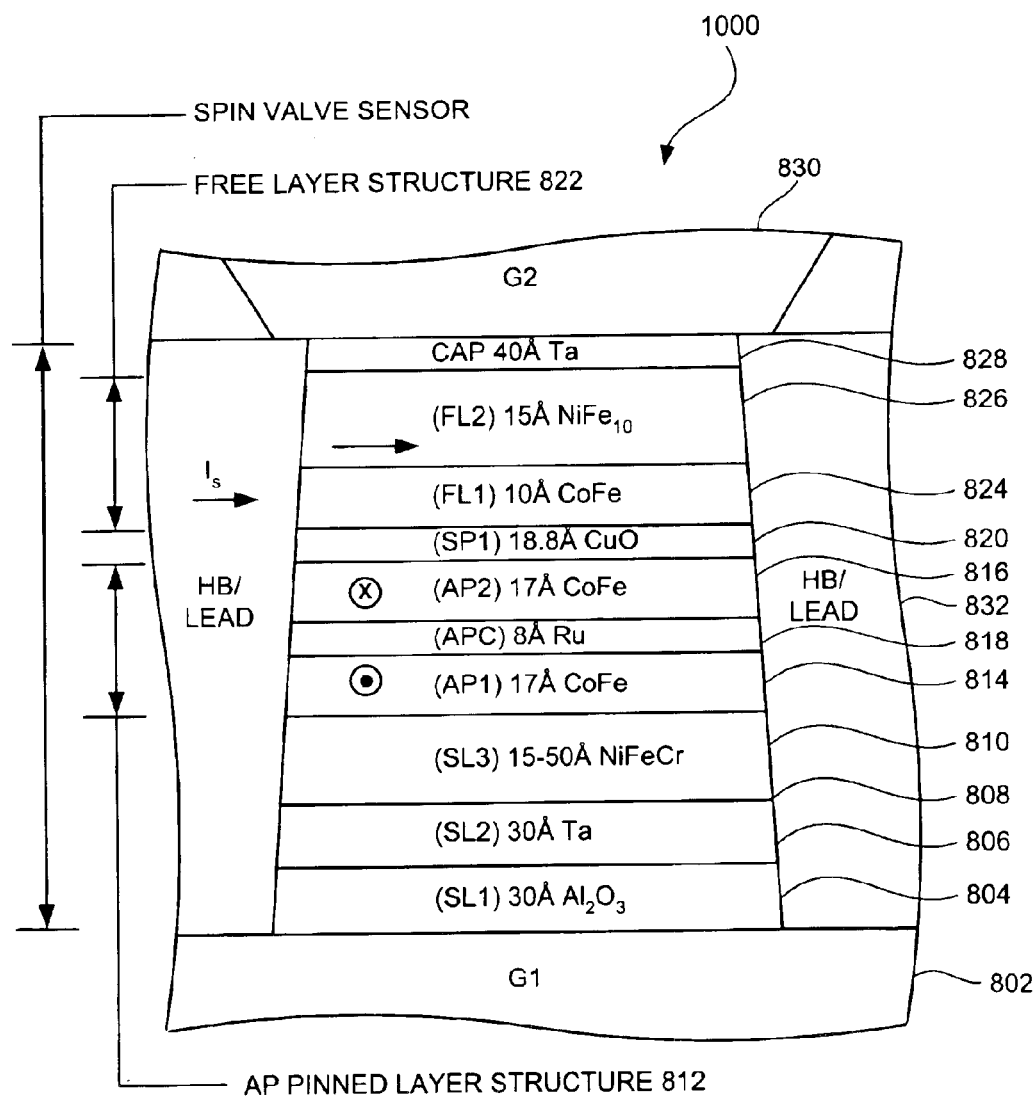
FIG. 10 depicts an ABS view, not to scale, of a GMR sensor constructed in accordance with Head G of FIG. 7.

FIG. 10 depicts an ABS view of GMR sensor 1000 constructed in accordance with Head G of FIG. 7. The GMR sensor 1000 generally has the same configuration as the structure shown in FIG. 8, except that pinned layers 814, 816 are each formed of CoFe.

One approach to stabilize the free layer 822 in all above embodiments is to use contiguous hard bias layers at the track edges of the sensor. For a CIP GMR sensor, these hard bias layers would be in electrical contact with the sensor stack.

Standard Head

Figure 11:
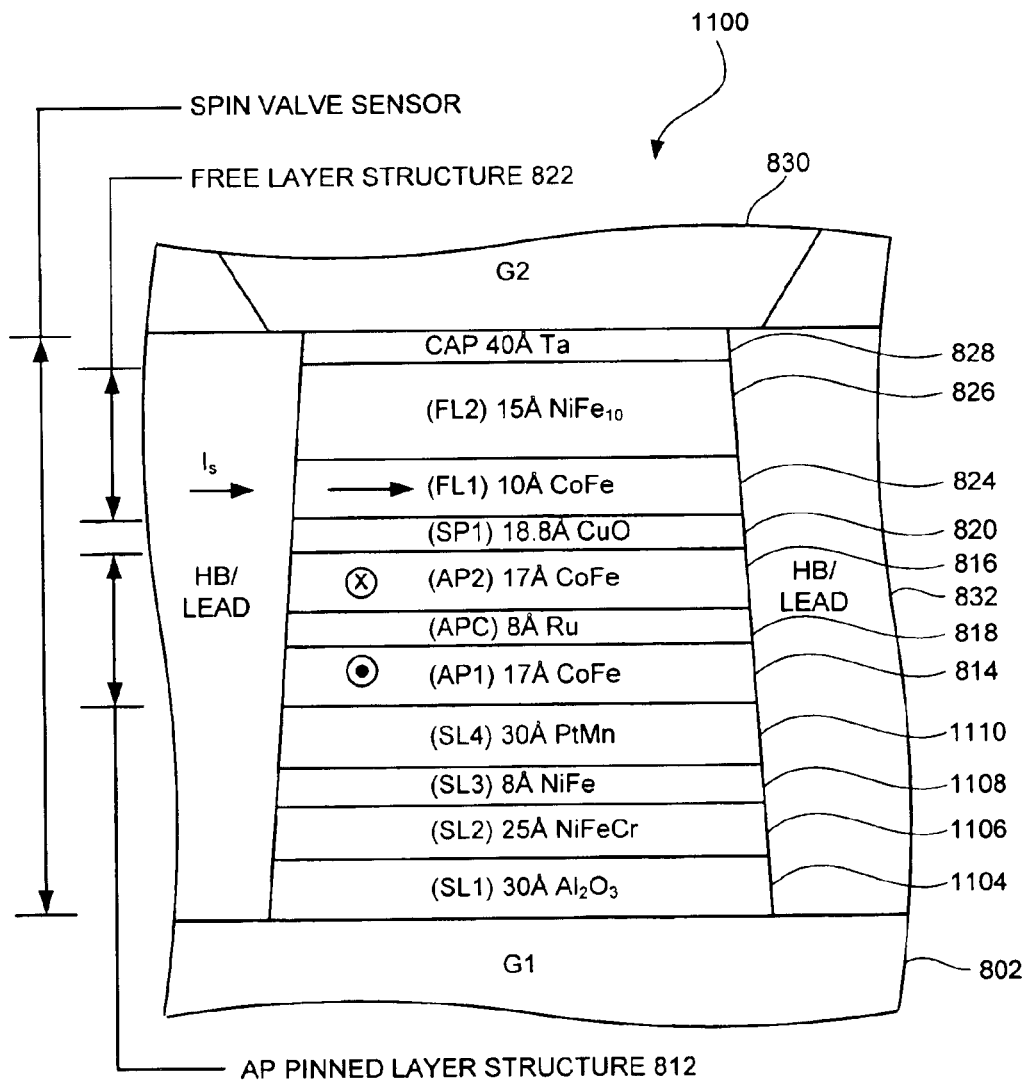
FIG. 11 depicts an ABS view of a standard GMR sensor constructed in accordance with the Standard Head of FIG. 7.

FIG. 11 depicts an ABS view of a standard GMR sensor 1100 constructed in accordance with the Standard Head of FIG. 7. The GMR sensor 1100 generally has the same configuration as the structure shown in FIG. 10, except that the materials formed in a stack from the first shield layer 802 are a layer of $Al_2O_3$ (SL1) 1104, a layer of NiFeCr (SL2) 1106, a layer of NiFe (SL3) 1108 and a layer of PtMn (SL4) 1110. Illustrative thicknesses of these materials are $Al_2O_3$ (30 Å), NiFeCr (25 Å), NiFe (8 Å), and PtMn (30 Å).

While various embodiments have been described above, it should be understood that they have been presented by way of example only, and not limitation. For example, the structures and methodologies presented herein are generic in their application to all GMR heads. Thus, the breadth and scope of a preferred embodiment should not be limited by any of the above-described exemplary embodiments, but should be defined only in accordance with the following claims and their equivalents.

What is claimed is:

1. A magnetic head, comprising:
   a seed layer structure comprising $Al_2O_3$, Ta, and NiFeCr seed layers;
   an antiparallel (AP) pinned layer structure formed directly on the NiFeCr seed layer; and
   a free layer positioned above the AP pinned layer structure.

2. A head as recited in claim 1, wherein the AP pinned layer structure includes at least two pinned layers having magnetic moments that are self-pinned antiparallel to each other, the pinned layers being separated by an AP coupling layer.

3. A head as recited in claim 2, wherein one of the AP pinned layers is constructed of CoFe and another AP pinned layer is constructed of substantially pure Co.

4. A head as recited in claim 3, wherein the pinned layer closest to the seed layer structure includes CoFe.

5. A head as recited in claim 2, wherein the AP pinned layers are constructed of substantially pure Co.

6. A head as recited in claim 2, wherein the AP pinned layers are constructed of CoFe.

7. A head as recited in claim 2, wherein the AP pinned layers are constructed of materials that maximize a magnetostriction of the AP pinned layers.

8. A head as recited in claim 1, wherein a thickness of the NiFeCr seed layer is maximizes a GMR signal.

9. A head as recited in claim 1, wherein the head has at least a 10% stronger GMR signal over a head having a substantially similar structure except for the seed layers.

10. A head as recited in claim 1, wherein the head has at least a 10% stronger GMR signal over a head having a substantially similar structure except for materials used to form the pinned layers.

11. A head as recited in claim 1, wherein the head forms part of a GMR head.

12. A head as recited in claim 1, wherein the head forms part of a CIP GMR sensor.

13. A magnetic storage system, comprising:
   magnetic media;
   at least one head for reading from and writing to the magnetic media, each head having:
      a sensor having the structure recited in claim 1;
      a write element coupled to the sensor;
   a slider for supporting the head; and
   a control unit coupled to the head for controlling operation of the head.

14. A magnetic head, comprising:
   a seed layer structure comprising $Al_2O_3$, Ta, and NiFeCr seed layers;
   an antiparallel (AP) pinned layer structure formed above the NiFeCr seed layer, wherein one of the AP pinned layers is constructed of CoFe and another of the AP pinned layers is constructed of substantially pure Co, wherein the pinned layer closest to the seed layer structure includes CoFe; and
   a free layer positioned above the AP pinned layer structure.

15. A head as recited in claim 14, wherein the head has at least a 10% stronger GMR signal over a head having a substantially similar structure except for the seed layers.

16. A head as recited in claim 14, wherein the head has at least a 10% stronger GMR signal over a head having a substantially similar structure except for materials used to form the pinned layers.

17. A head as recited in claim 14, wherein the head forms part of a GMR head.

18. A magnetic storage system, comprising:
   magnetic media;
   at least one head for reading from and writing to the magnetic media, each head having:
      a sensor having the structure recited in claim 14;
      a write element coupled to the sensor;
   a slider for supporting the head; and
   a control unit coupled to the head for controlling operation of the head.

19. A magnetic head, comprising:
   a seed layer structure comprising $Al_2O_3$, Ta, and NiFeCr seed layers;
   an antiparallel (AP) pinned layer structure formed above the NiFeCr seed layer, wherein one of the AP pinned layers is constructed of substantially pure Co and another of the AP pinned layers is constructed of substantially pure Co; and
   a free layer positioned above the AP pined layer structure.

20. A head as recited in claim 19, wherein the head has at least a 10% higher positive magnetostriction over a head having a substantially similar structure except for the seed layers.

* * * * *

UNITED STATES PATENT AND TRADEMARK OFFICE
CERTIFICATE OF CORRECTION

PATENT NO. : 6,961,224 B2  
APPLICATION NO. : 10/671377  
DATED : November 1, 2005  
INVENTOR(S) : Pinarbasi It is certified that error appears in the above-identified patent and that said Letters Patent is hereby corrected as shown below:

On the title page, item (56) References Cited:
please add --2003/0030434 A1 to Hasegawa et al.--.

Signed and Sealed this

Seventeenth Day of October, 2006

JON W. DUDAS  
*Director of the United States Patent and Trademark Office*